United States Patent
Rolland

(10) Patent No.: US 8,823,363 B2
(45) Date of Patent: Sep. 2, 2014

(54) ELECTRIC METER EQUIPPED WITH A REMOVABLE COVER THAT CAN BE POSITIONED IN TWO POSITIONS

(75) Inventor: Patrick Rolland, Rueil Malmaison (FR)

(73) Assignee: Sagemcom Energy & Telecom SAS, Rueil, Malmaison (FR)

( * ) Notice: Subject to any disclaimer, the term of this patent is extended or adjusted under 35 U.S.C. 154(b) by 134 days.

(21) Appl. No.: 13/579,426

(22) PCT Filed: Feb. 21, 2011

(86) PCT No.: PCT/EP2011/000822
§ 371 (c)(1),
(2), (4) Date: Aug. 16, 2012

(87) PCT Pub. No.: WO2011/103991
PCT Pub. Date: Sep. 1, 2011

(65) Prior Publication Data
US 2012/0313622 A1 Dec. 13, 2012

(30) Foreign Application Priority Data
Feb. 24, 2010 (FR) .................................. 10 51328

(51) Int. Cl.
*G01R 1/04* (2006.01)
*G01R 11/04* (2006.01)

(52) U.S. Cl.
CPC ..................................... *G01R 11/04* (2013.01)
USPC ........... 324/156; 361/665; 361/666; 361/667; 174/66

(58) Field of Classification Search
CPC ....................................................... G01R 11/04
USPC .......... 324/156; 361/665–667, 601, 616, 725, 361/727, 668; 174/66
See application file for complete search history.

(56) References Cited

U.S. PATENT DOCUMENTS

| | | | |
|---|---|---|---|
| 2,182,603 A | 12/1939 | Walker et al. | |
| 2,279,165 A | 4/1942 | Grace | |
| 2,842,741 A * | 7/1958 | Simkins | 324/149 |
| 3,087,097 A | 4/1963 | Janson | |
| 3,846,677 A * | 11/1974 | Keever et al. | 361/659 |
| 4,110,814 A * | 8/1978 | Britton et al. | 361/666 |
| 5,027,056 A * | 6/1991 | Russillo et al. | 324/103 R |
| 5,196,783 A * | 3/1993 | Howell | 324/110 |
| 5,644,551 A * | 7/1997 | Carmichael et al. | 368/5 |
| 6,280,805 B1 | 8/2001 | Markovich | |
| 6,498,717 B2 * | 12/2002 | Matthews | 361/665 |
| 6,614,219 B2 * | 9/2003 | Dadian | 324/142 |
| 8,116,072 B2 * | 2/2012 | Kagan et al. | 361/664 |

* cited by examiner

*Primary Examiner* — Arleen M Vazquez
*Assistant Examiner* — Robert P Alejnikov, Jr.
(74) *Attorney, Agent, or Firm* — Muncy, Geissler, Olds & Lowe, P.C.

(57) ABSTRACT

An electricity meter comprising a box defining a terminal block for connection to cables and a removable cover covering the terminal block at least in part, wherein the meter includes fastener means arranged to hold said cover on a front face of the box while uncovering the terminal block and while leaving visible an inside face of the cover including means for explaining its electrical connection.

6 Claims, 2 Drawing Sheets

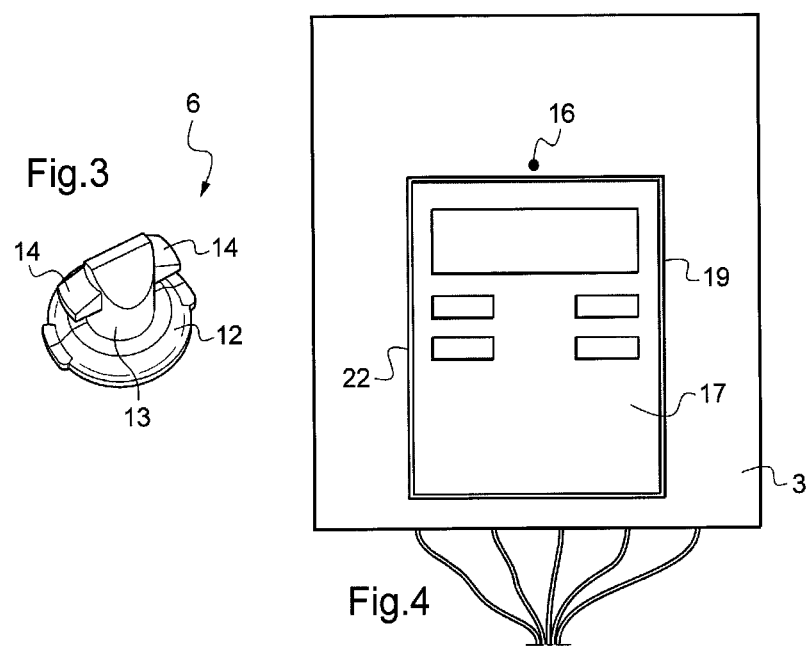
Fig.3
Fig.4
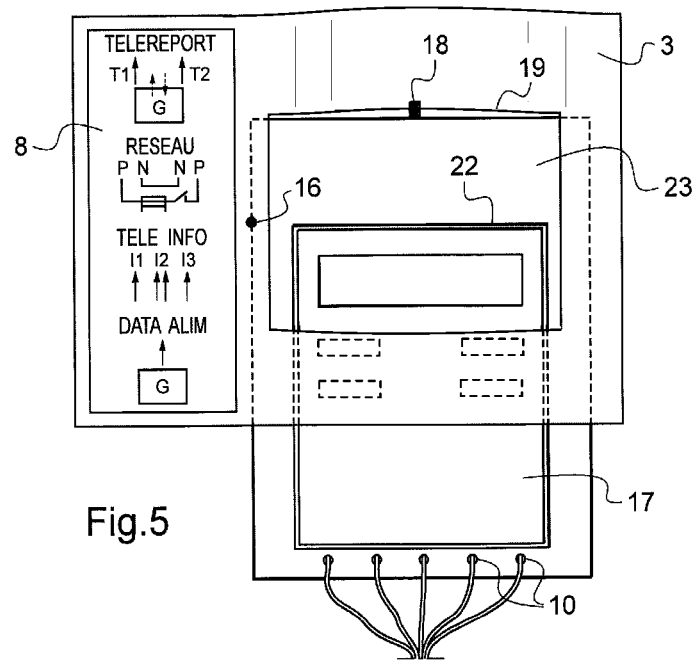
Fig.5 though the screw 6 is engaged in the orifice 11 and is turned through one-quarter of a turn in the orifice, the cover 3 is held to the box in a closed position where it covers the terminal block.
ELECTRIC METER EQUIPPED WITH A REMOVABLE COVER THAT CAN BE POSITIONED IN TWO POSITIONS The present invention relates to an electricity meter including a removable cover that can be positioned on the meter in two positions.

BACKGROUND OF THE INVENTION

Electricity meters are known in the prior art that comprise a box defining a terminal block that is arranged to enable electric cables to be connected to the meter. The meter has a cover that covers the terminal block so as to prevent access to the various electrical connections of the meter. Furthermore, such a cover generally includes, on its inside face, a wiring diagram that enables a user taking action on the meter to set up the electrical connections in compliance with the diagram or to verify whether the connections already present are in compliance.

Prior art solutions do not propose any device enabling the operator to keep the wiring diagrams in view while also leaving the hands free. This means that the operator acting on the cables needs to hold the cover in view while also holding the cables and the tools needed for working on them. It can readily be understood that any normal operator finds that difficult.

OBJECT OF THE INVENTION

The object of the invention is thus to propose a simple solution enabling the cover of an electricity meter to be held in its closed position, and also in an open position so as to facilitate making connections.

BRIEF DESCRIPTION OF THE INVENTION

To this end, the invention provides an electricity meter comprising a box defining a terminal block for connection to cables and a removable cover covering the terminal block at least in part. The meter includes fastener means arranged to hold said cover on a front face of the box while uncovering the terminal block and while leaving visible an inside face of the cover for a user situated looking at the front face of the box.

Fastening the cover in the vicinity of the electrical connection zone in question thus makes it easy to access information specific to the wiring and the installation of the meter without it being necessary to put the cover down on the ground, or to hold it in the hand, or without there being any chance of it being lost while a user is taking action on the meter.

In a first embodiment, the fastener means of the device comprise a quarter-turn type screw that is held captive to the cover, comprising an anchoring shank surmounted by a head, the shank being arranged to hold the cover on the box while covering the terminal block, and the box including a housing for receiving the head and for holding the cover on the box while uncovering the terminal block.

The quarter-turn screw thus performs two functions, since it enables the cover to be fastened in two distinct positions. This is an ideal solution since no additional part is required and the quarter-turn screw can also be held captive. Naturally, the same principle could also make use of a dedicated part.

Advantageously, the screw is mounted to move axially between a first position in which the head is sunk in the cover so as to enable the cover to be fastened on the box over the terminal block, and a second position in which the head projects from the cover in order to enable the head to be inserted in the housing in the box.

In a second embodiment, the fastener means of the device comprise an abutment arranged on the box to hold the cover when it covers the terminal block.

Thus, the cover is held in place merely by coming into abutment.

The abutment is preferably positioned in such a manner that the cover is deformed when the cover is in abutment and in position on the box so as to leave the terminal block uncovered.

This enables the cover to be held firmly in position.

BRIEF DESCRIPTION OF THE DRAWINGS

Other characteristics and advantages of the invention appear on reading the following description of particular embodiments of the invention given with reference to the accompanying figures, in which:

FIG. 3 is a perspective view of a quarter-turn screw used in the first embodiment;

FIG. 4 is a face view of a second embodiment of the invention, the cover being in the closed position; and FIG. 5 is a face view of the second embodiment of the invention, the cover being in the open position.

DETAILED DESCRIPTION OF THE INVENTION

Figure 1:
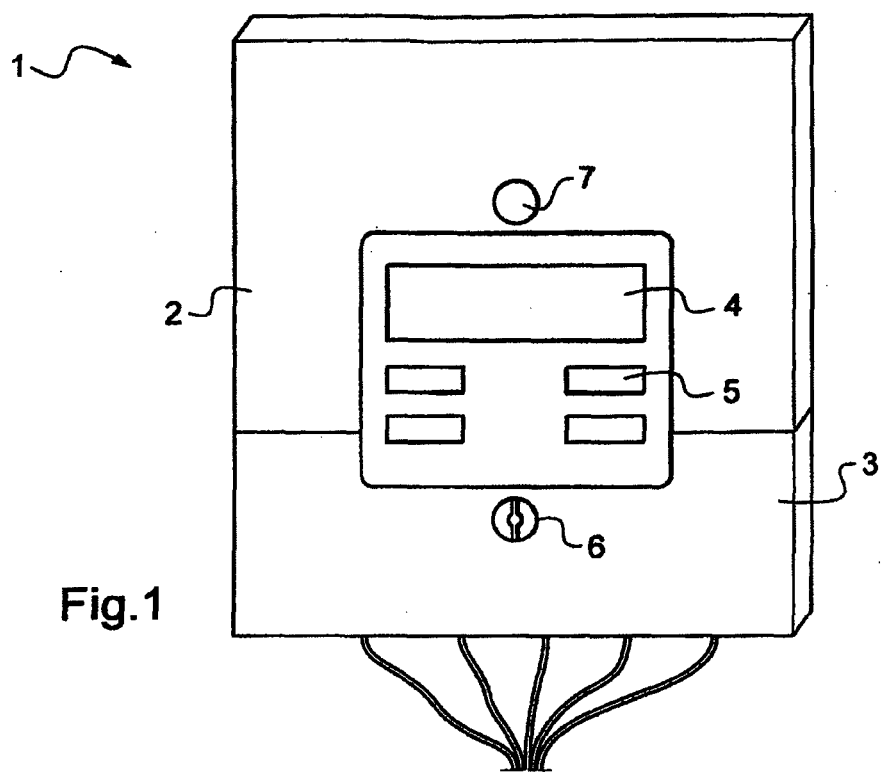
FIG. 1 is a face view of a first embodiment of the invention, the cover being in the closed position.

With reference to FIG. 1, the electricity meter 1 comprises a box 2 that houses various electrical elements used for measuring a quantity of energy that has been consumed, a cover 3 hiding a connection terminal block, a display 4 for displaying information relating to energy consumption, and various buttons enabling the various functions of the electricity meter to be controlled.

The cover 3 is held in the closed position on the box 2 with the help of a quarter-turn type screw 6. The screw 6 passes through the cover 3 and is held captive therein axially while being free to turn. FIG. 3 shows the screw 6, which screw comprises a head 12, a shank 13, and two projections 14 extending perpendicularly to the axis of the shank of the screw 6 from the free end of the shank 13.

The box 2 defines an orifice 11 arranged in the box 2 so that when the screw 6 is engaged in the orifice 11 and is turned through one-quarter of a turn in the orifice, the cover 3 is held to the box in a closed position where it covers the terminal block.

Figure 2:
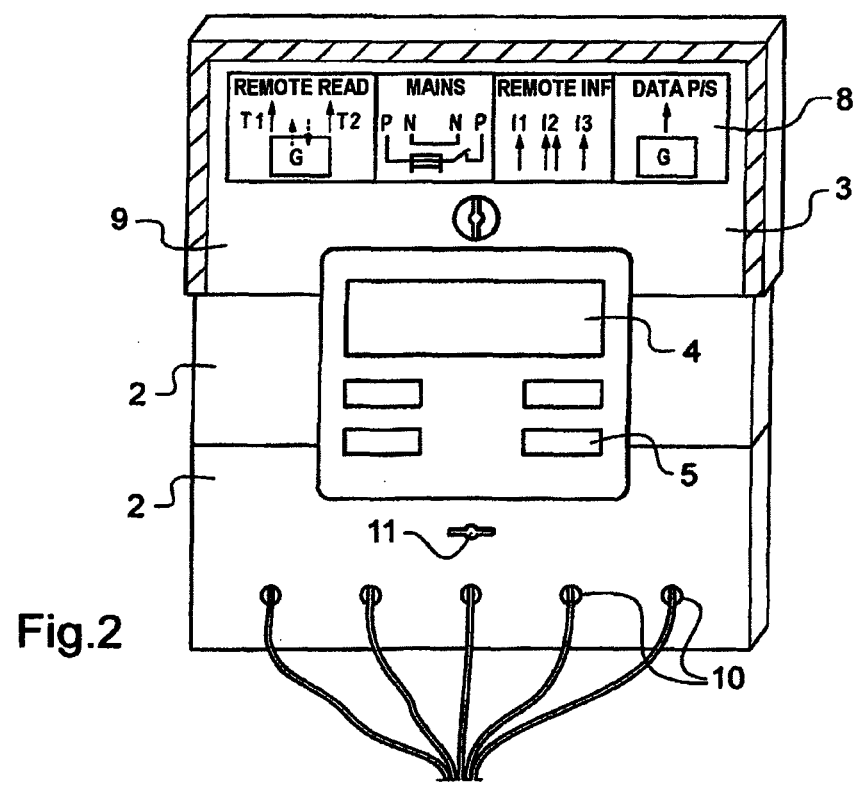
FIG. 2 is a face view of the first embodiment of the invention, the cover being in the open position.

The box 2 also defines a housing 7 directly molded therewith that is suitable for receiving and holding the head of the screw 6, as shown in FIG. 2, which shows the same electricity meter 1 as FIG. 1 but in an open position of the cover, which is thus held on the box 2 in such a manner as to uncover the box 2 while showing an inside face of the cover. For this purpose, the head of the screw 6 is forced into the housing 7 and then holds the cover 3 in the open position. Such a configuration thus gives a user access to information 8 specific to the wiring and the installation, which information may be printed, etched, or stuck onto the inside face of the cover 3.

The cover 3 as fastened in this way uncovers the terminal block and gives access to the various cable connections 10 of the meter.

It should be observed that the screw 6 is mounted on the cover 3 with axial clearance between the screw 6 and the cover 3. The screw 6 is thus axially movable between a first position in which the head is sunk in the cover so as to allow the cover to be fastened on the box over the terminal block (FIG. 1), and a second position in which the head projects from the cover in order to enable the head to be inserted in the housing in the box that is used for fastening the cover 3 in the open position (FIG. 2).

The cover 3 is thus fastened in the closed position and in the open position by using opposite ends of the screw 6 depending on the desired configuration.

FIG. 4 shows a second embodiment of the invention in which the cover 3 hiding the electrical connections of the meter also constitutes trim for the meter 17 by defining a front plate thereof. The cover 3 has a rectangular opening 19 provided so that the cover surrounds the display when the cover 3 is in the closed position as shown in FIG. 4. For this purpose, the meter includes a shoulder zone 22 surrounding the display and of thickness equal to the thickness of the cover 3. The cover 3 is then fastened to a support zone 23 extending immediately beyond the shoulder 22 over the entire periphery of the meter 17 with the help of a single screw 16 passing through the cover 3.

The cover 3 is shown here in the closed position. In a variant, the cover 3 may also be fastened to the meter 17 by snap-fastening.

FIG. 5 shows the cover 3 in the open position of the second embodiment. The top portion of the support zone 23 of the meter 17 includes a lug 18, or more particularly an abutment, against which one of the edges of the opening 19 in the cover 3 comes to rest so that the information 8 specific to the wiring and the installation and arranged on the inside face of the cover is made visible to a user and the electrical connections 10 of the meter are made accessible.

For the connections 10 of the meter 17 to be accessible, the cover 3 of rectangular shape is arranged with its long direction vertical in the closed position as shown in FIG. 4, and with its long direction horizontal in the open position.

The arrangement of the support zone 23 of the meter 17 and of the cover 3 in the open position therefore does not allow the opening 19 to surround the support zone 23 of the meter 17 complementary. Consequently, the cover 3 is fastened onto the abutment 18 by elastically deforming the cover 3 in the edge of the opening 19 that comes into abutment against the lug 18.

Naturally, the invention is not limited to the embodiments described above and may be subjected to variants that will appear to the person skilled in the art without going beyond the ambit of the invention as defined by the claims.

The cover may be held mechanically on the box by any means, and for example by elastic deformation, by clip-fastening, by snap-fastening, by locking, . . . .

What is claimed is:

1. An electricity meter comprising:
   a box defining a terminal block for connection to cables; and
   a removable cover covering the terminal block at least in part,
   wherein the meter includes fastener means arranged to hold said cover on a front face of the box while uncovering the terminal block and while leaving visible an inside face of the cover for a user situated looking at the front face of the box,
   wherein the cover is configured to be held in a closed position and an open position,
   wherein the fastenter means is configured to hold said cover in the open position on the front face of the box,
   wherein, in the closed position, the cover covers the terminal block at least in part, and
   wherein, in the open position, the cover uncovers the terminal block.

2. The meter according to claim 1, wherein the fastener means of the device comprise a quarter-turn type screw that is held captive to the cover, comprising an anchoring shank surmounted by a head, the shank being arranged to hold the cover on the box while covering the terminal block, and the box including a housing for receiving the head and for holding the cover on the box while uncovering the terminal block.

3. The meter according to claim 2, wherein the screw is mounted to move axially between a first position in which the head is sunk in the cover so as to enable the cover to be fastened on the box over the terminal block, and a second position in which the head projects from the cover in order to enable the head to be inserted in the housing in the box.

4. The meter according to claim 2, wherein the housing and the head are of dimensions such that the head of the screw is engaged by force in the housing.

5. The meter according to claim 1, wherein the fastener means of the device comprise an abutment arranged on the box to hold the cover when it covers the terminal block.

6. The meter according to claim 5, wherein the abutment is positioned in such a manner that the cover is deformed when the cover is in abutment and in position on the box to leave the terminal block uncovered.

* * * * *